(12) United States Patent
Gyun

(10) Patent No.: US 7,217,632 B2
(45) Date of Patent: May 15, 2007

(54) ISOLATION METHODS IN SEMICONDUCTOR DEVICES

(75) Inventor: Ahn Heui Gyun, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 42 days.

(21) Appl. No.: 11/021,032

(22) Filed: Dec. 23, 2004

(65) Prior Publication Data
US 2005/0142797 A1   Jun. 30, 2005

(30) Foreign Application Priority Data
Dec. 24, 2003   (KR) .................. 10-2003-0096987

(51) Int. Cl.
*H01L 21/76* (2006.01)
(52) U.S. Cl. ................ 438/424; 257/E21.001
(58) Field of Classification Search ........ 438/424, 438/425, 426, 427, 428
See application file for complete search history.

(56) References Cited

U.S. PATENT DOCUMENTS

| | | | |
|---|---|---|---|
| 6,291,300 B1 * | 9/2001 | Fukazawa et al. .......... 438/296 |
| 6,306,741 B1 * | 10/2001 | Lee et al. ................ 438/585 |
| 6,333,232 B1 * | 12/2001 | Kunikiyo ............... 438/296 |
| 6,383,911 B2 * | 5/2002 | Mikagi ................ 438/623 |
| 6,661,043 B1 * | 12/2003 | Huang et al. ........... 257/243 |
| 6,696,360 B2 * | 2/2004 | Ahn et al. ............. 438/632 |
| 6,709,951 B2 * | 3/2004 | Beyer et al. ............ 438/424 |
| 2002/0086495 A1 * | 7/2002 | Yoo et al. ............. 438/423 |

* cited by examiner

Primary Examiner—Scott B. Geyer
(74) Attorney, Agent, or Firm—Andrew D. Fortney

(57) ABSTRACT

Methods of forming a device isolation layer in a semiconductor substrate are disclosed. A disclosed method includes: forming a trench in a field area of a semiconductor substrate, growing a SiON layer on an inside of the trench by annealing in an ambience of NO gas, and filling the trench with a trench-fill material.

2 Claims, 6 Drawing Sheets

ISOLATION METHODS IN SEMICONDUCTOR DEVICES

FIELD OF THE DISCLOSURE

The present disclosure relates generally to isolation methods in semiconductor devices, and more particularly, to methods of forming a device isolation layer in a semiconductor substrate.

BACKGROUND

Generally, in a semiconductor circuit, various devices such as transistors, diodes, resistors and the like must be electrically isolated from each other. Because of the tendency toward high integration of semiconductor devices and because the channel length and the width of a field oxide layer for device isolation are reduced, micro patterns are needed to accomplish such isolation in device fabrication.

LOCOS (local oxidation of silicon) has been very popular as a device isolation method. The LOCOS method comprises: sequentially forming a pad oxide layer and a nitride layer on a silicon substrate; patterning the nitride layer; and forming a field oxide layer by selectively performing oxidation on the silicon substrate. One shortcoming of LOCOS device isolation is that a bird's beak often occurs at an edge of the field oxide layer because oxygen penetrates into a lateral side of the pad oxide layer from a bottom of the nitride layer used as a mask in the selective oxidation of the silicon substrate. The length of the bird's beak extends the field oxide layer to an active area, thereby shortening the channel length and increasing a threshold voltage to induce the so-called short channel effect. As a result, the electric characteristics of the transistor are degraded. Specifically, in a LOCOS device isolation exhibiting the short channel effect, the punch-through phenomenon takes place. Punch-through is a phenomenon which occurs when the channel length is reduced below 0.3 μm and the field oxide layers defining the active area merge into one. As a result, the field oxide layers are unable to secure an accurate width of the active area. Thus, certain limitations are placed on LOCOS device isolation.

Recently, trench isolation has been employed in semiconductor fabrication performed according to a design rule below 0.25 μm. Trench isolation comprises forming a trench by removing a portion of a semiconductor substrate and filling up the trench with an insulator.

In the latest device isolation techniques, shallow trench isolation is mainly used. Shallow trench isolation comprises: forming a trench by locally removing a portion of a silicon substrate; depositing an insulating layer, (e.g., an oxide layer), on the silicon substrate; and removing the insulating layer on an active area by CMP (chemical mechanical polishing) to leave only a portion of the insulating layer in the trench as a field isolation area. The STI method, which employs a trench depth below 3 μm, is applicable to a design rule below 0.15 μm.

The STI method reduces the size of the device isolation area relative to the substrate. In an STI method a trench provided in a semiconductor substrate is filled up with silicon oxide by CVD (chemical vapor deposition). The STI method prevents the bird's beak problem mentioned above to thereby avoid a loss of an active area that is planarized.

Meanwhile, as the gate length is decreased, the leakage current component occurring in the STI employing the trench device isolation layer is divided into diffusion current and a drift current. The drift current flows through a shortest distance between devices, but the diffusion current flows along an interface of the oxide layer.

As mentioned in the above explanation, the STI method comprises: forming a trench by etching a silicon substrate to a prescribed depth; depositing an insulating layer on the substrate and in the trench; and etching the insulating layer by an etch-back process or CMP to leave the insulating layer within the trench only. Currently, USG (undoped silicate glass), TEOS (tetraethyl orthosilicate), HTO (high temperature oxide), or a combination thereof is used as the oxide layer filling the trench. Such a filing material has a heat budget smaller than that of thermal oxide formed by oxidation, exhibits throughput higher than that of thermal oxide, and has a wet etch rate faster than that of thermal oxide.

A prior art semiconductor device isolation method using STI will now be explained with reference to FIGS. 1A to 1F. FIGS. 1A to 1F are cross-sectional illustrations of a prior art method of forming a trench type device isolation layer in a semiconductor device.

Referring to FIG. 1A, a pad oxide layer 13 is formed on a silicon substrate 11 by thermal oxidation.

A nitride layer 15 is deposited on the pad oxide layer 13.

Referring to FIG. 1B, a photoresist pattern 17 is formed on the nitride layer 15 to have an opening A that defines a device isolation area of the silicon substrate 11.

Referring to FIG. 1C, the nitride layer 15 and the pad oxide layer 13 are etched using the photoresist pattern 17 as an etch mask to expose a portion of the substrate 11.

The exposed portion of the substrate 11 is etched using the photoresist pattern 17 and the remaining nitride layer pattern 15' and pad oxide layer pattern 13' as a mask to form a trench B having a predetermined depth.

Optionally, after the photoresist pattern 17 has been removed, the trench B may be formed using the remaining nitride layer pattern 15' and pad oxide layer pattern 13' as an etch mask.

The trench B is formed for shallow trench isolation.

Referring to FIG. 1D, after the photoresist pattern 17 has been removed; a liner oxide layer 19 is formed on an inside of the trench by STI liner oxidation to prevent STI damage. The liner oxide layer 19 is used to solve the problems of stress generated from the expansion of a filled oxide layer that will be formed later by oxidation. Specifically, the liner oxide layer 19 functions as an oxidation barrier suppressing oxidant diffusion into the sidewalls of the trench.

Referring to FIG. 1E, a gap-fill material layer 21 such as a TEOS (tetraethyl orthosilicate) layer or a HDP (high density plasma) CVD layer is deposited over the substrate 11 including the liner oxide layer 19 thereby filling the trench.

Referring to FIG. 1F, the gap-fill material layer 21 is planarized by chemical mechanical polishing (CMP) to expose the nitride layer pattern 15'.

Annealing is then performed on the substrate at a prescribed temperature.

Subsequently, the pad oxide layer pattern and the nitride layer pattern are removed by wet etching.

The gap-fill material layer 21 in FIG. 1E remains in the trench and, thus, becomes an STI layer 21'.

A method of forming a trench device isolation layer of a semiconductor device is described in Korean Patent Application No. 1999-45566, filed on Oct. 20, 1999. This method employs a SiN liner oxide layer formed by low pressure CVD.

Specifically, the method described in Korean Patent Application No. 1999-45566 comprises: forming a trench on a field area of a semiconductor substrate; growing a thermal oxide layer on an inside of the trench; forming a silicon oxy nitride (SiON) layer on an interface between the thermal oxide layer and the silicon substrate by annealing in an ambience of $N_2O$; forming an oxidation barrier layer by depositing silicon nitride on an inside of the trench; filling the trench with an oxide layer; and planarizing the oxide layer to form a device isolation layer. This method forms a device isolation layer capable of preventing out-diffusion of boron (B) with less stress.

However, as the width of the trench is decreased due to a reduced design rule or scale, the process/device margin is shortened. The conventional STI is unable to control leakage current and diffusion current despite the excellent device isolation feature.

BRIEF DESCRIPTION OF THE DRAWINGS

Wherever possible, the same reference numbers are used throughout the drawings to refer to the same or like parts.

DETAILED DESCRIPTION

In the following examples, a silicon oxy nitride layer is formed by annealing with NO gas or by N type ion implantation, instead of forming a liner oxide layer prior to trench filling. Alternatively, plasma nitridation is carried out on a liner oxide layer to enhance an interface insulating property. As a result, the disclosed examples satisfy the characteristics required for semiconductor device isolation.

Figure 1A:
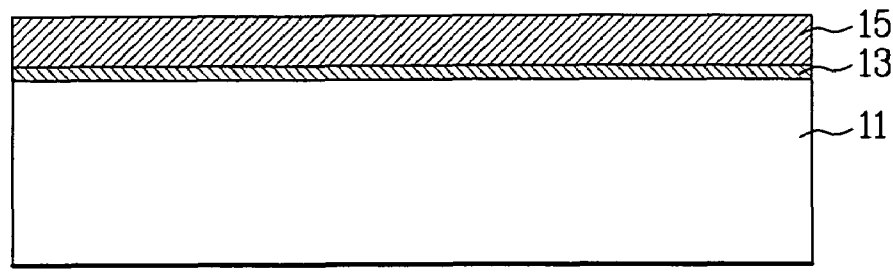
FIGS. 1A to 1F are cross-sectional illustrations of a prior art method of forming a trench type device isolation layer in a semiconductor device.
Figure 1B:
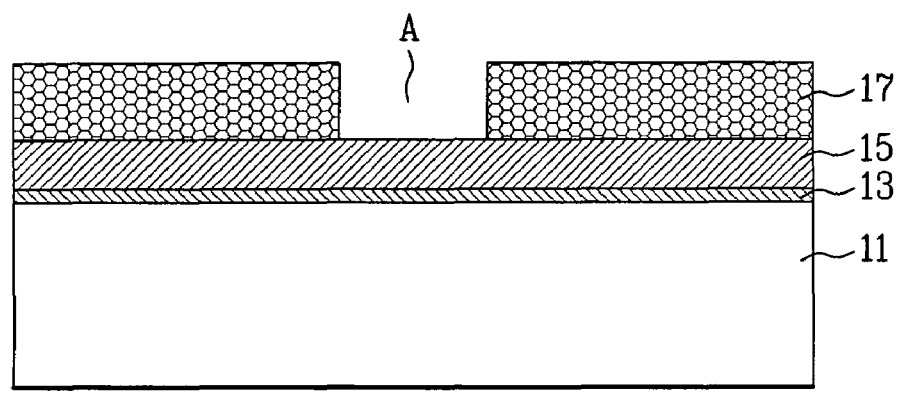
Figure 1C:
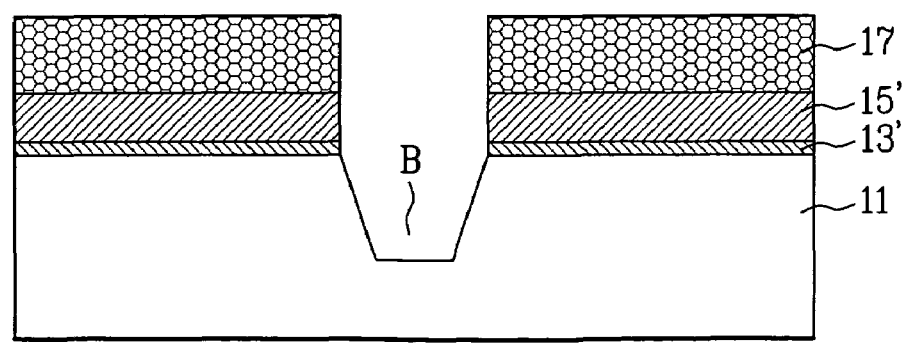
Figure 1D:
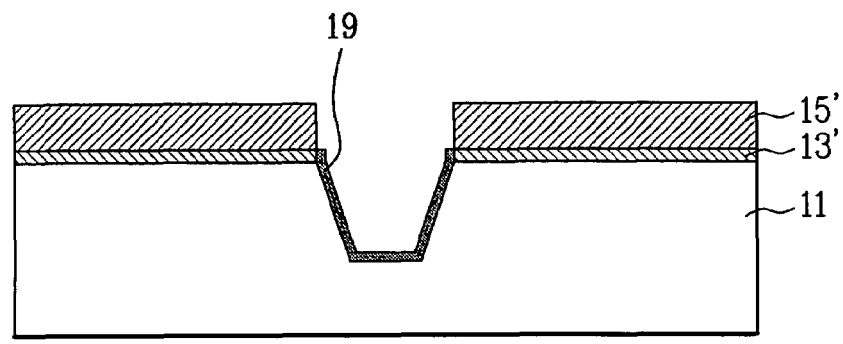
Figure 1E:
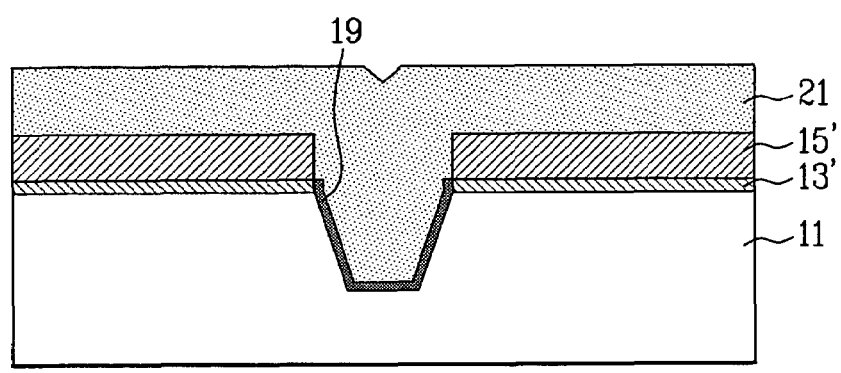
Figure 1F:
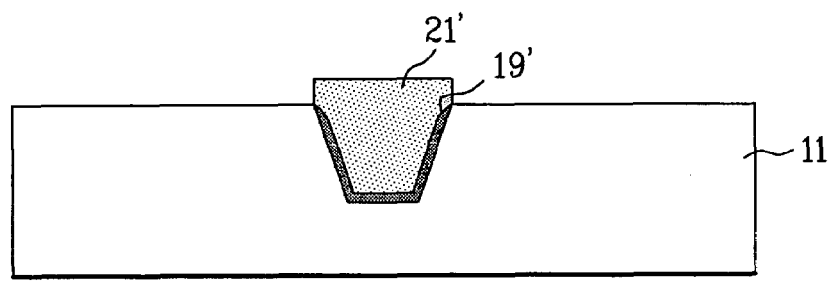
Figure 2A:
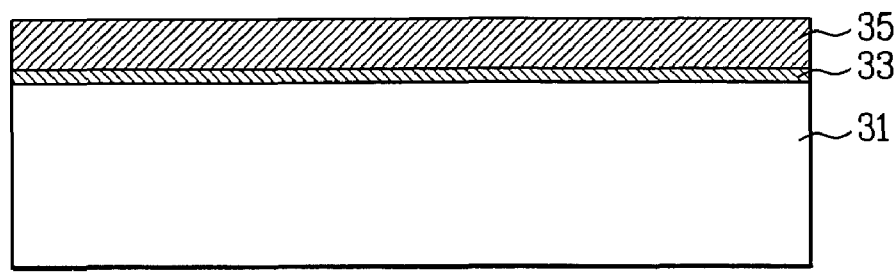
FIGS. 2A to 2F are cross-sectional views of an example method of forming a device isolation layer in a semiconductor device performed in accordance with the teachings of the present invention.

FIGS. 2A to 2F are cross-sectional diagrams illustrating an example method of forming a device isolation layer in a semiconductor device performed in accordance with the teachings of the present invention. Referring to FIG. 2A, a pad oxide layer 33 is formed on a silicon substrate 31 by thermal oxidation. A nitride layer 35 is then deposited on the pad oxide layer 33.

Figure 2B:
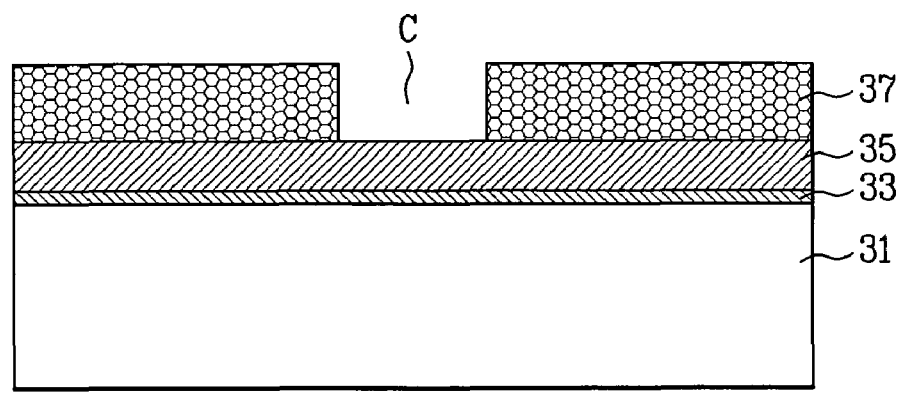

Referring to FIG. 2B, a photoresist pattern 37 is formed on the nitride layer 35 to have an opening C that defines a device isolation area of the silicon substrate 31.

Figure 2C:
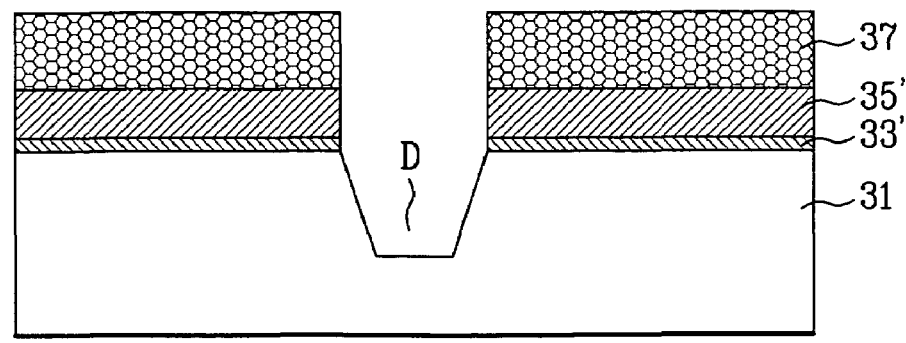

Referring to FIG. 2C, the nitride layer 35 and the pad oxide layer 33 are sequentially etched using the photoresist pattern 37 as an etch mask to expose a portion of the substrate 31.

The exposed portion of the substrate 31 is then etched using the photoresist pattern 37 and the remaining nitride layer pattern 35' and pad oxide layer pattern 33' as a mask to form a trench D having a predetermined depth.

Optionally, after the photoresist pattern 37 has been removed, the trench D may be formed using the remaining nitride layer pattern 15' and pad oxide layer pattern 13' as an etch mask.

Irrespective of the etching approach taken, the trench D is formed for shallow trench isolation.

Figure 2D:
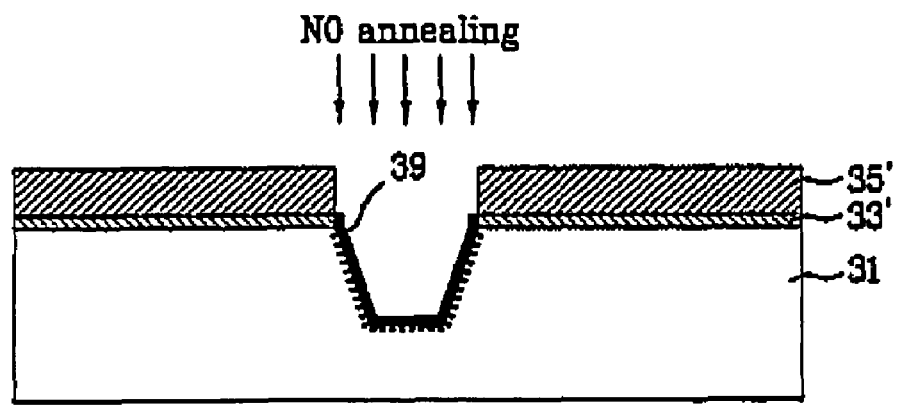

Referring to FIG. 2D, after the photoresist pattern 37 has been removed; a silicon oxynitride (SiON) layer 39 is formed on an inside of the trench by annealing in an ambience of NO gas. The SiON layer 39 protects the surface of the silicon substrate 31 in the trench from STI damage. It bears emphasis that, in the example of FIGS. 2A–2F, the prior art liner oxide layer is not formed.

In the illustrated example, the NO annealing is performed for about 5~30 minutes at a temperature of about 850~950° C. in an ambience of NO gas diluted to about 9.5:1~8.2 l/min.

Optionally, considering the Si—O—N bonds lost by the annealing, nitrogen ion implantation may also be performed on the substrate 31 at a high dose of dopant.

Figure 2E:
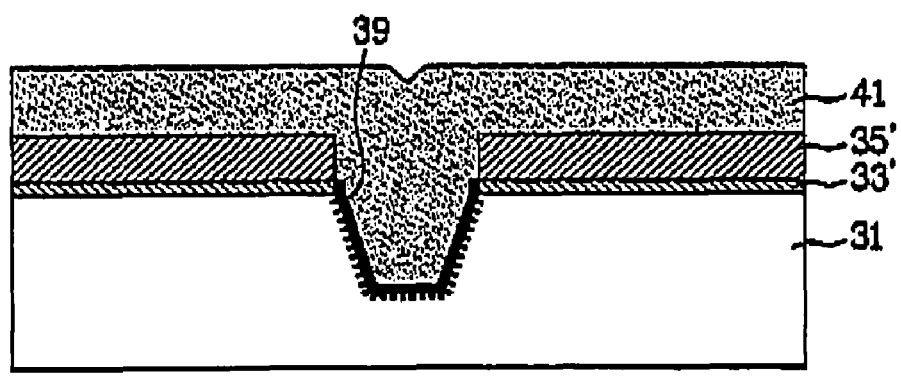

Referring to FIG. 2E, a gap-fill material layer 41 such as a TEOS (tetraethyl orthosilicate) layer or a HDP (high density plasma) CVD layer is deposited over the substrate 31 including the SiON layer 39 to fill up the trench.

Figure 2F:
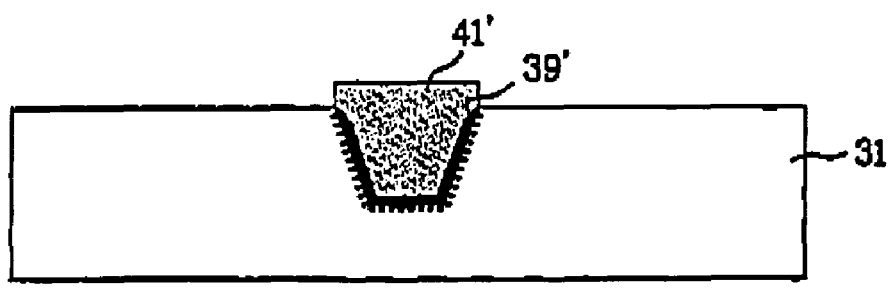

Referring to FIG. 2F, the gap-fill material layer 41 of FIG. 2E is planarized by chemical mechanical polishing (CMP) to expose the nitride layer pattern 35'. Annealing is then performed on the substrate 31 at a prescribed temperature.

Subsequently, the pad oxide layer pattern and the nitride layer pattern are removed by wet etching. As a result, the gap-fill material layer 41 of FIG. 2E is removed from everywhere but in the trench to become an STI layer 41'.

Figure 3A:
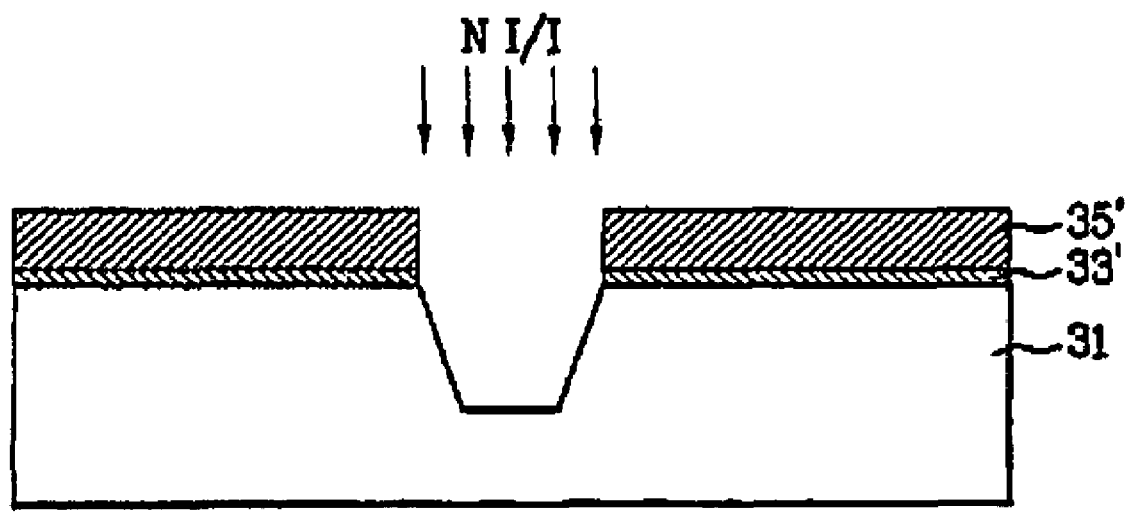
FIGS. 3A and 3B are cross-sectional views of another example method of forming a device isolation layer in a semiconductor device performed in accordance with the teachings of the present invention.
Figure 3B:
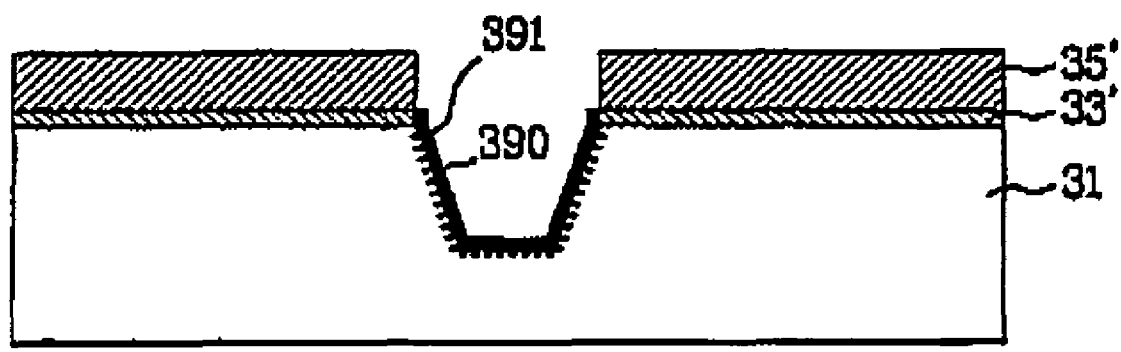

FIGS. 3A and 3B are cross-sectional diagrams illustrating another method of forming a device isolation layer in a semiconductor device performed in accordance with the teachings of the present invention. First, the processes described above in connection with FIGS. 2A to 2C are performed.

Subsequently, nitrogen ion implantation is carried out on the silicon substrate 31 using the nitride layer pattern 35' having the pad oxide layer pattern 33' underneath as an ion implantation mask (see FIG. 3A).

Referring to FIG. 3B, a liner oxide layer 390 is formed on an inside of the trench, (i.e., on the exposed portion of the silicon substrate 31).

A SiON layer 391 is then formed on an interface between the silicon substrate 31 and the liner oxide layer 390 using the implanted nitrogen ions.

Subsequently, the processes described above in connection with FIGS. 2E to 2F are performed to complete an STI layer.

Figure 4A:
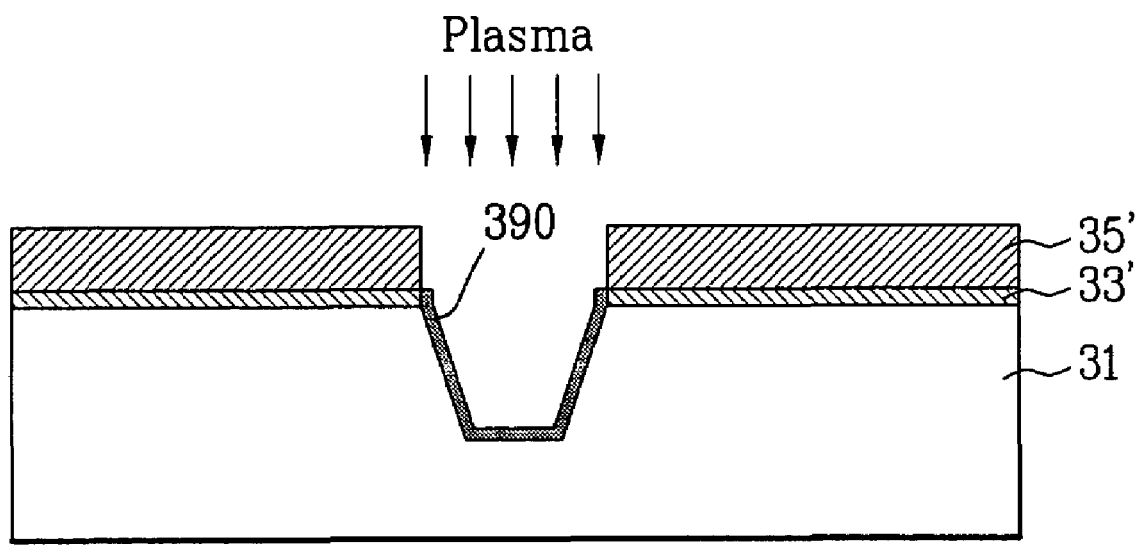
FIGS. 4A and 4B are cross-sectional views of still another example method of forming a device isolation layer in a semiconductor device performed in accordance with the teachings of the present invention.
Figure 4B:
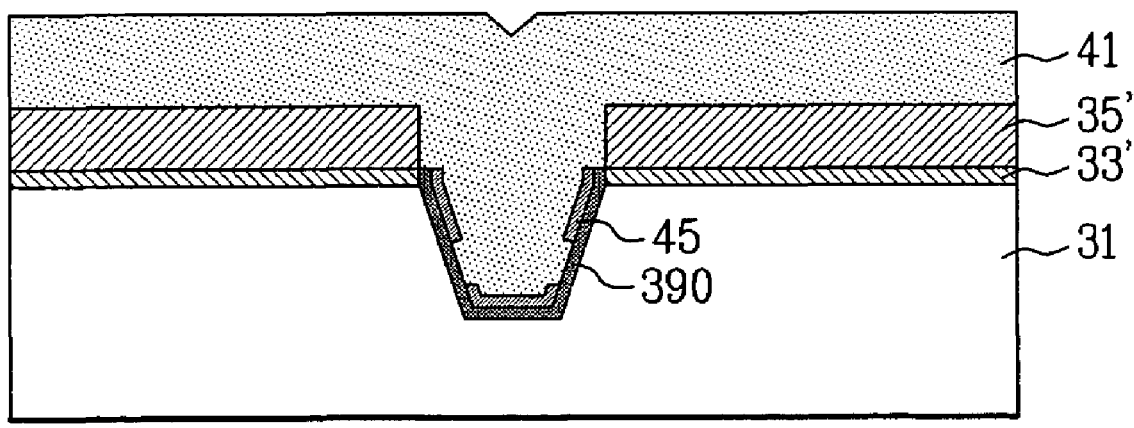

FIGS. 4A and 4B are cross-sectional diagrams illustrating another example method of forming a device isolation layer in a semiconductor device performed in accordance with the teachings of the present invention. Referring to FIG. 4A, the processed described above in connection with FIGS. 2A to 2C are first performed.

Subsequently, a liner oxide layer 390 is formed on an inside of the trench, (i.e., on the exposed portion of the silicon substrate 31).

Nitridation is then carried out on the liner oxide layer 390 by rapid thermal processing (RTP) or by using other plasma equipment. Referring to FIG. 4B, due to the nitridation, a SiON layer 45 is formed on a surface of the liner oxide layer 390. The plasma nitridation used in the second example differs from the prior art nitride layer formed by LPCVD in that the deposited nitride layer is oxidized in the prior art method.

Subsequently, a gap-fill material layer 41 such as a TEOS (tetraethyl orthosilicate) layer or a HDP (high density plasma) CVD layer is deposited over the substrate 31 including the SiON layer 45 to fill up the trench.

Thereafter, the processes described above in connection with FIG. 2F are performed to complete an STI layer.

As explained above in connection with the illustrated examples, by forming the SiON layer by NO gas annealing without forming the liner oxide layer (see the first example), by forming the SiON layer after N ion implantation (see the second example), or by forming the SiON layer after plasma nitridation (see third example), the insulation property on the interface of the trench is enhanced to meet the characteristics required for semiconductor device isolation. Leakage current is also prevented to thereby enable a reduced device isolation layer.

Further, the nitrogen (N) used in the above examples is very resistant against boron (B). As a result, the nitrogen is capable of suppressing out-diffusion of boron in the p-well into STI. Moreover, boron segregation due to impurity re-distribution occurring during annealing for silicon oxidation is prevented to sustain uniform well density. Accordingly, persons of ordinary skill in the art will appreciate that the illustrated examples suppress leakage current and, thus, facilitate an increase in the degree of integration in a semiconductor device.

From the foregoing, persons of ordinary skill in the art will appreciate that the illustrated examples prevent out-diffusion of boron into the STI. Such persons will also appreciate that the illustrated examples prevent boron segregation and, thus, sustain uniform well density, to thereby enhance the reliability of a semiconductor device. As a result, isolation methods are provided by which an oxide layer having an improved insulation property can be provided in a trench prior to filling the trench.

A disclosed example isolation method comprises: forming a trench in a field area of a semiconductor substrate; growing a SiON layer on an inside of the trench by annealing in an ambience of NO gas; and filling the trench with a trench-fill material.

Preferably, the isolation method further includes performing heavy nitrogen ion implantation on the SiON layer.

Preferably, the annealing is carried out for about 5~30 minutes at a temperature of about 850~950° C. in an ambience of NO gas diluted to about 9.5:1~8.2 l/min.

Another disclosed example isolation method includes: forming a trench in a field area of a semiconductor substrate; forming a SiON layer on an inside of the trench by nitrogen ion implantation; and filling the trench with a trench-fill material.

Another disclosed example isolation method includes: forming a trench in a field area of a semiconductor substrate; forming a SiON layer on an inside of the trench by nitridation using plasma equipment; and filling the trench with a trench-fill material.

It is noted that this patent claims priority from Korean Patent Application Ser. No. P2003-0096987, which was filed on Dec. 24, 2003, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An isolation method comprising:
    forming a trench in a semiconductor substrate;
    growing a SiON layer on an inside of the trench by annealing in an ambience of NO gas performing heavy nitrogen ion implantation on the SiON layer; and
    filling the trench with a trench-fill material.

2. An isolation method as defined in claim 1, wherein the annealing is performed for about 5~30 minutes at a temperature of about 850~950° C. in the ambience of the NO gas diluted to about 9.5:1~8.2 l/min.

* * * * *